United States Patent [19]

Brasen et al.

[11] Patent Number: 5,313,079
[45] Date of Patent: May 17, 1994

[54] GATE ARRAY BASES WITH FLEXIBLE ROUTING

[75] Inventors: Daniel R. Brasen, San Jose; James D. Shiffer, II, Fremont; Mark R. Hartoog, Los Gatos; Sunil Asktaputre, San Jose, all of Calif.

[73] Assignee: VLSI Technology, Inc., San Jose, Calif.

[21] Appl. No.: 953,032

[22] Filed: Sep. 25, 1992

Related U.S. Application Data

[63] Continuation-in-part of Ser. No. 902,183, Jun. 22, 1992.

[51] Int. Cl.$^5$ .............................................. H01L 27/10
[52] U.S. Cl. .................................. 257/206; 257/210; 257/909
[58] Field of Search ............... 257/207, 211, 206, 204, 257/909, 923, 210

[56] References Cited

U.S. PATENT DOCUMENTS 5,008,728  4/1991  Vomamura ........................ 257/211
5,206,529  4/1993  Mine .................................. 257/207

OTHER PUBLICATIONS

Anderson, et al., A 0.5 Micron 150K Channelless Gate Array, IEEE Custom Integrated Circuits Conference, pp. 35–38, (1987).

Chan, et al., Advanced Structured arrays combine High Density memories with Channel-free Logic Array, IEEE Custom Integrated Circuits Conference, pp. 39–43, (1987).

Hsu, et al., The ChipCompiler, An Automated Standard Cell-Macrocell Physical Design Tool, IEEE custom Integrated Circuits Conference, pp. 488–491, (1987).

Hui, et al., A Sub Half-ns 237K Gate CMOS Compacted Array, IEEE Custom Integrated Circuits Conference, pp. 20.4.1–20.4.3, (1988).

Kobayashi, et al., DLM/TLM Compatible 1.0 um Gate Array with Over 100K usable Gates, IEEE Custom Integrated Circuits Conference, pp. 20.9.1–20.9.4, (1988).

Kubosawa, et al., Layout Approaches to High–density Channelless Masterslice, IEEE Cusom Integrated Circuits Conference, pp. 48–51, (1987).

Ng, et al., A Hierarchical Floor-Planning, Placement, and Routing Tool for Sea-of-Gates Designs, IEEE Custom Integrated Circuits Conference, pp. 3.3.1–3.3.4, (1989).

Okuno, et al., 0.8 um 1.4MTr. CMOS SOG based on Column Macro–cell, IEEE Custom Integrated Circuits Conference, pp. 8.2.1–8.2.4, (1989).

Wong, et al., A High Performance 129K Gate CMOS Array, IEEE 1986 Custom Integrated Circuits Conference, pp. 568–571, (1986).

*Primary Examiner*—Robert Limanek
*Attorney, Agent, or Firm*—Burns, Doane, Swecker & Mathis

[57] ABSTRACT

Flexible routing of gate arrays increases routing efficiency, provides for the routing of functional blocks with other gates in the gate array, and provides structures for flexible power routing, particularly of gate arrays having functional blocks. In particular, a gate-array-implemented integrated circuit is designed using a computer by representing in computer memory a gate array base, placing gate array cells on the gate array base in placement rows each having a uniform height and separated by routing channels in which no gate array cells are placed, and routing in the routing channel connections between placement rows according to a netlist, during routing increasing the size of a routing channel if required and decreasing the size of a routing channel if possible by changing the placement of at least one placement row by an amount less than half the height of the placement row. Routing channel size is therefore flexibly adjusted "on-the-fly" during routing, increasing routing efficiency. The adjustment of routing channels in small (5 track) increments is made possible by defining "tall" macros (four transistor rows high) made of "small" (5 track high) transistors.

5 Claims, 12 Drawing Sheets

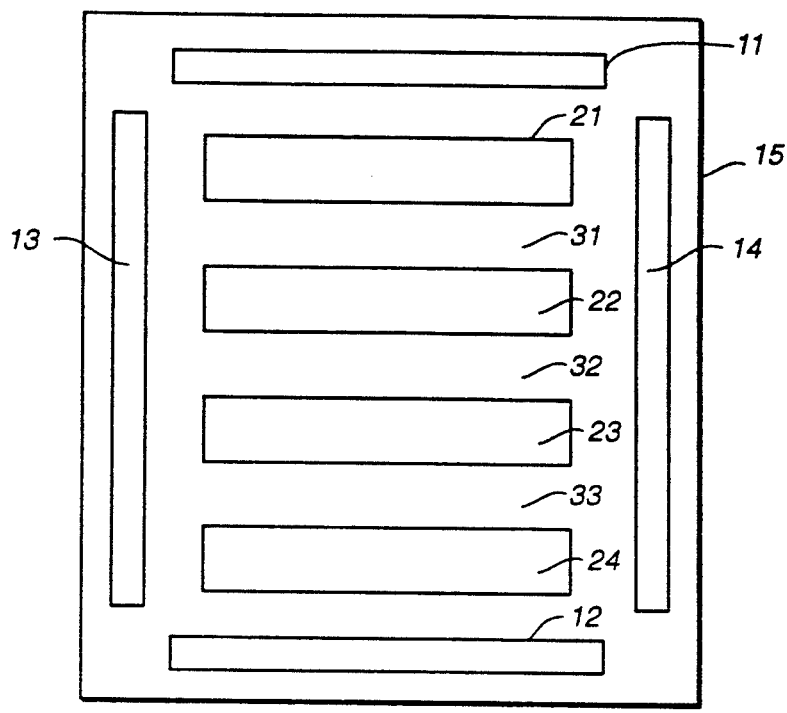
FIG._1
(PRIOR ART)
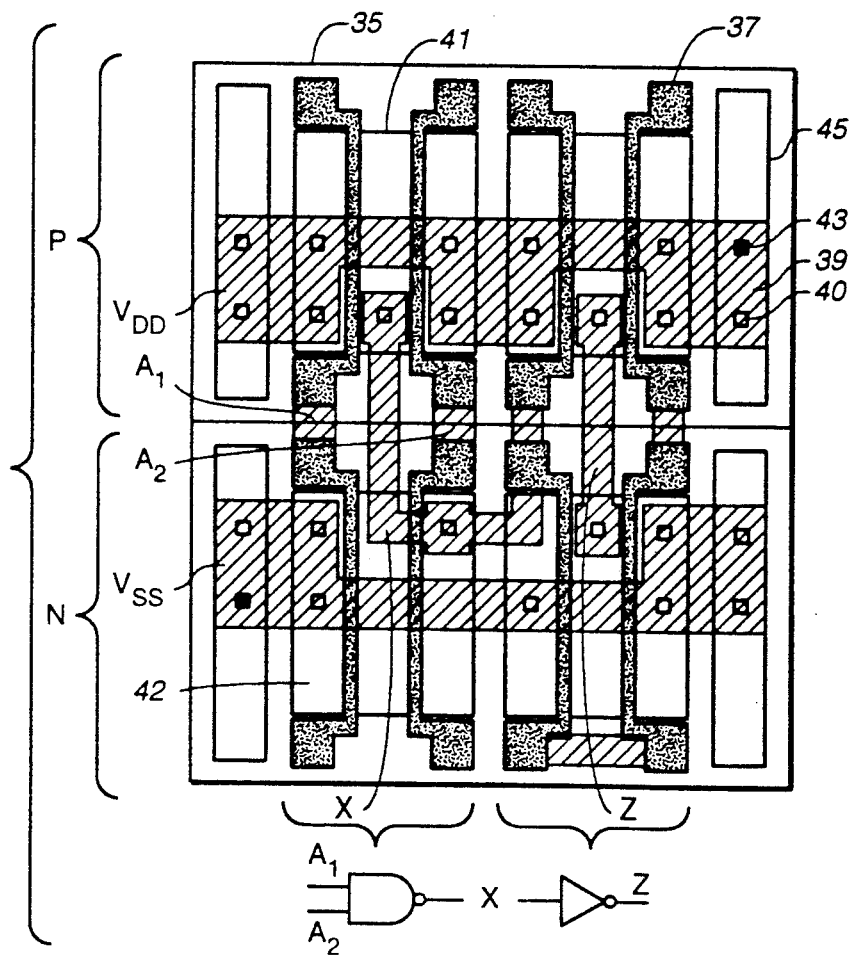
FIG._2B
(PRIOR ART)

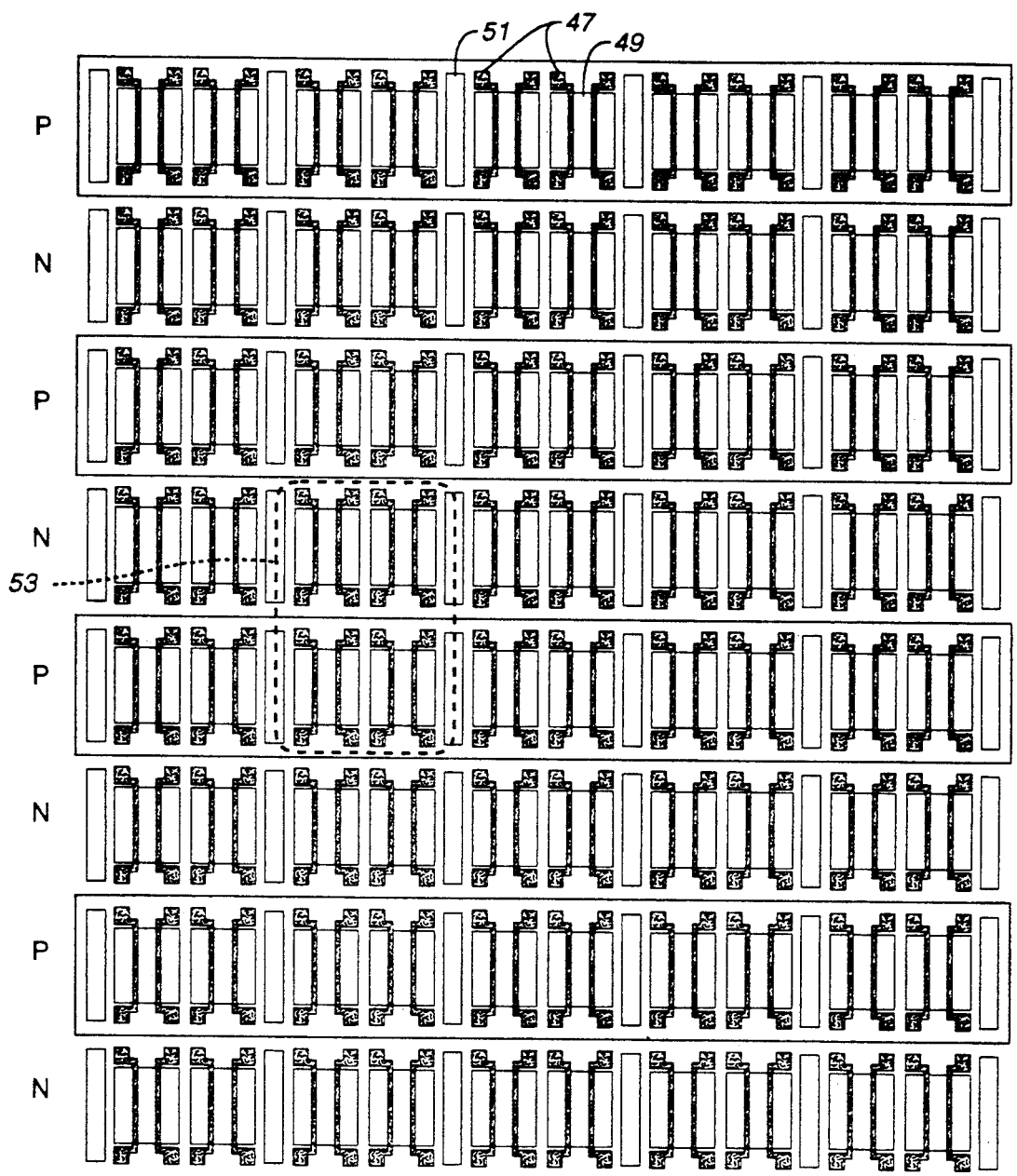
FIG._2A

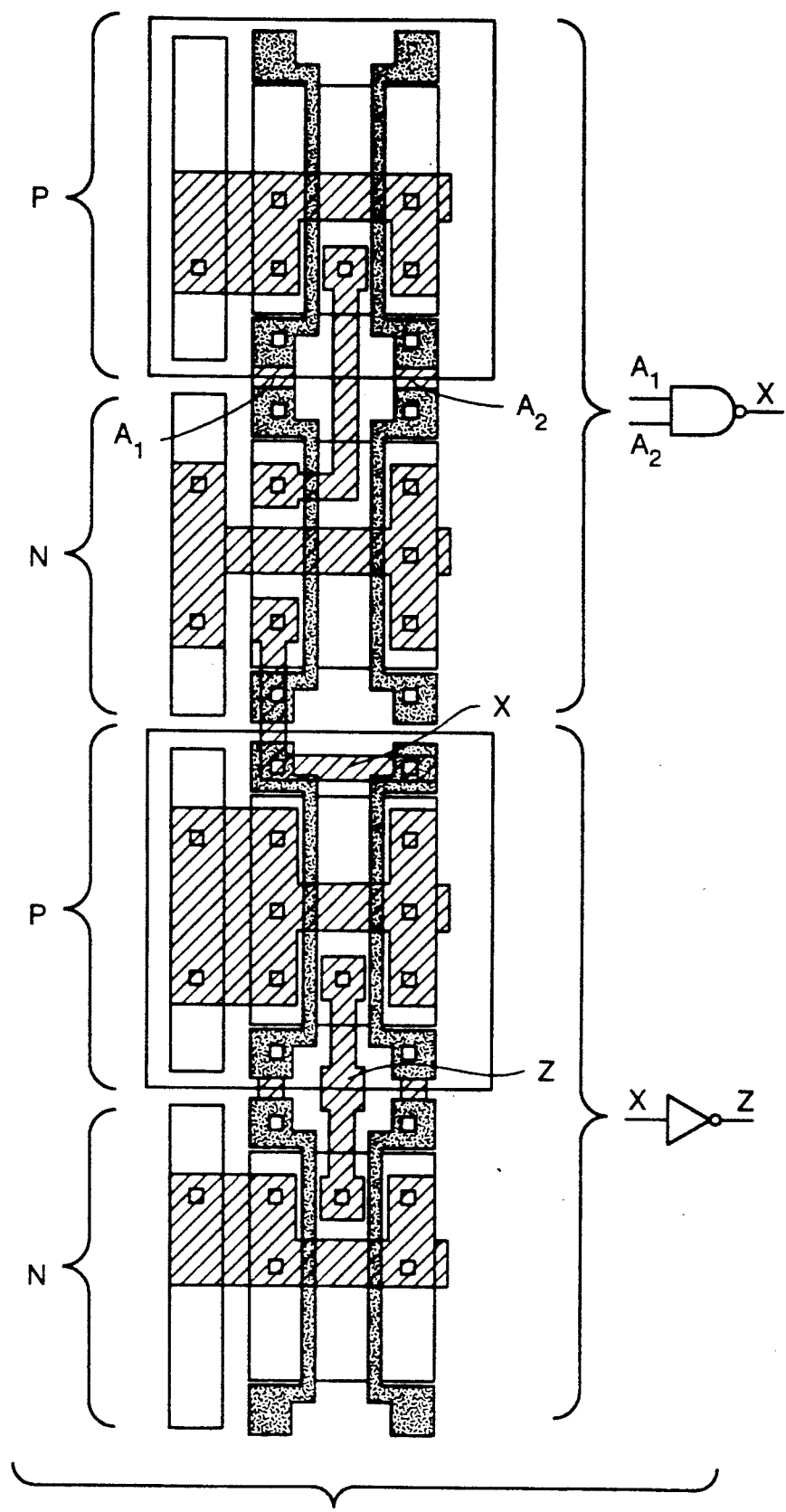
FIG._3

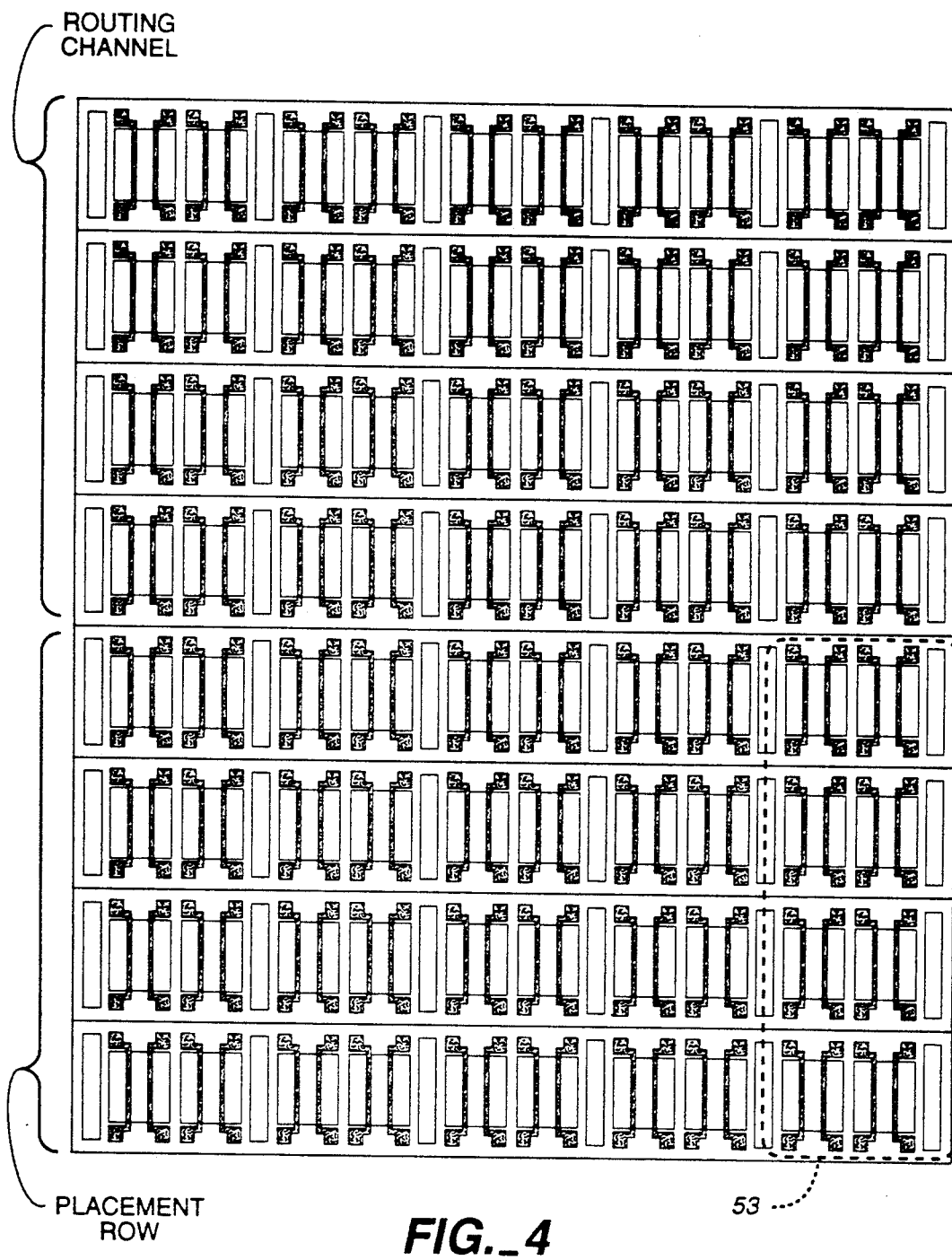
FIG._4

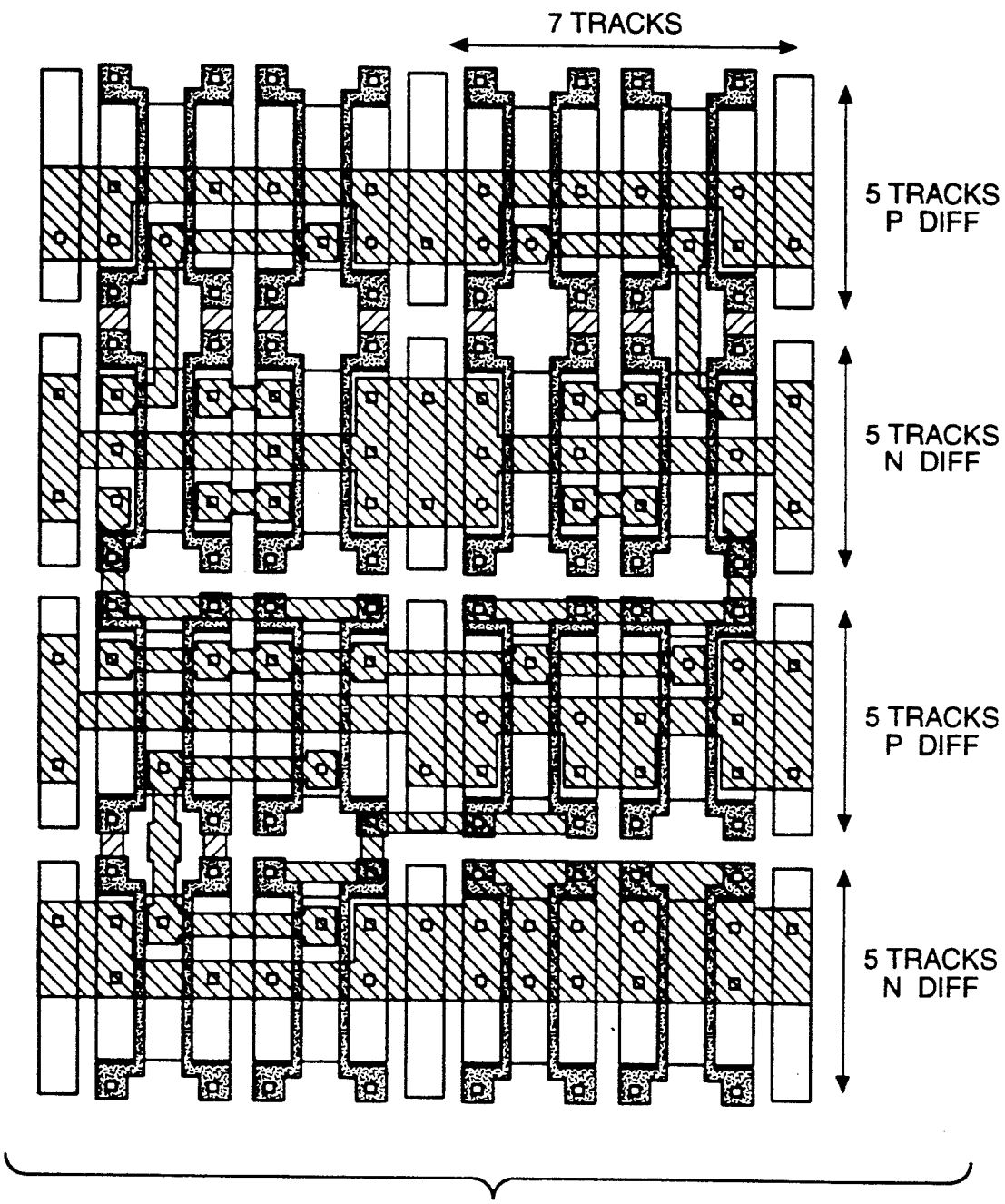
FIG._5

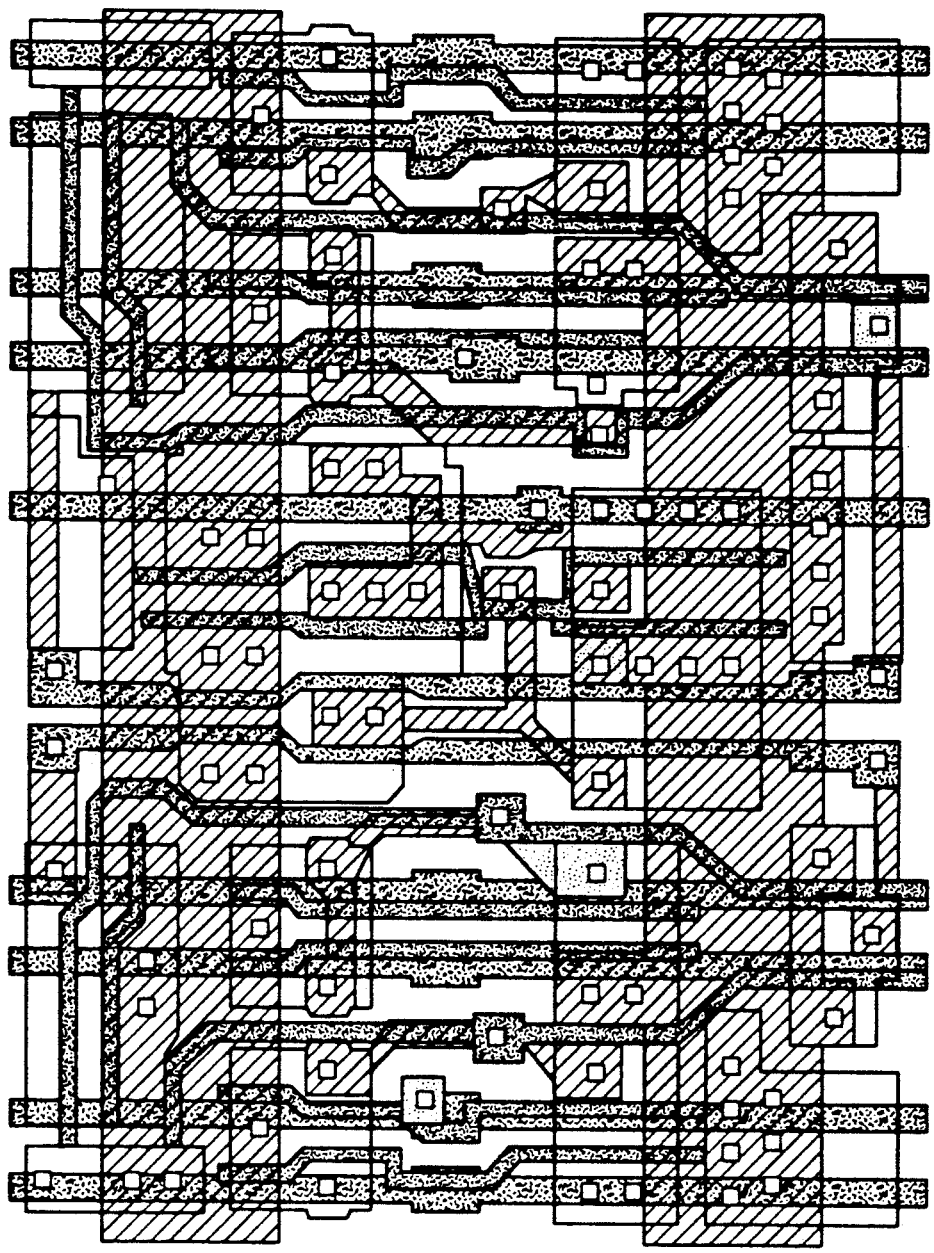
FIG._6
(PRIOR ART)

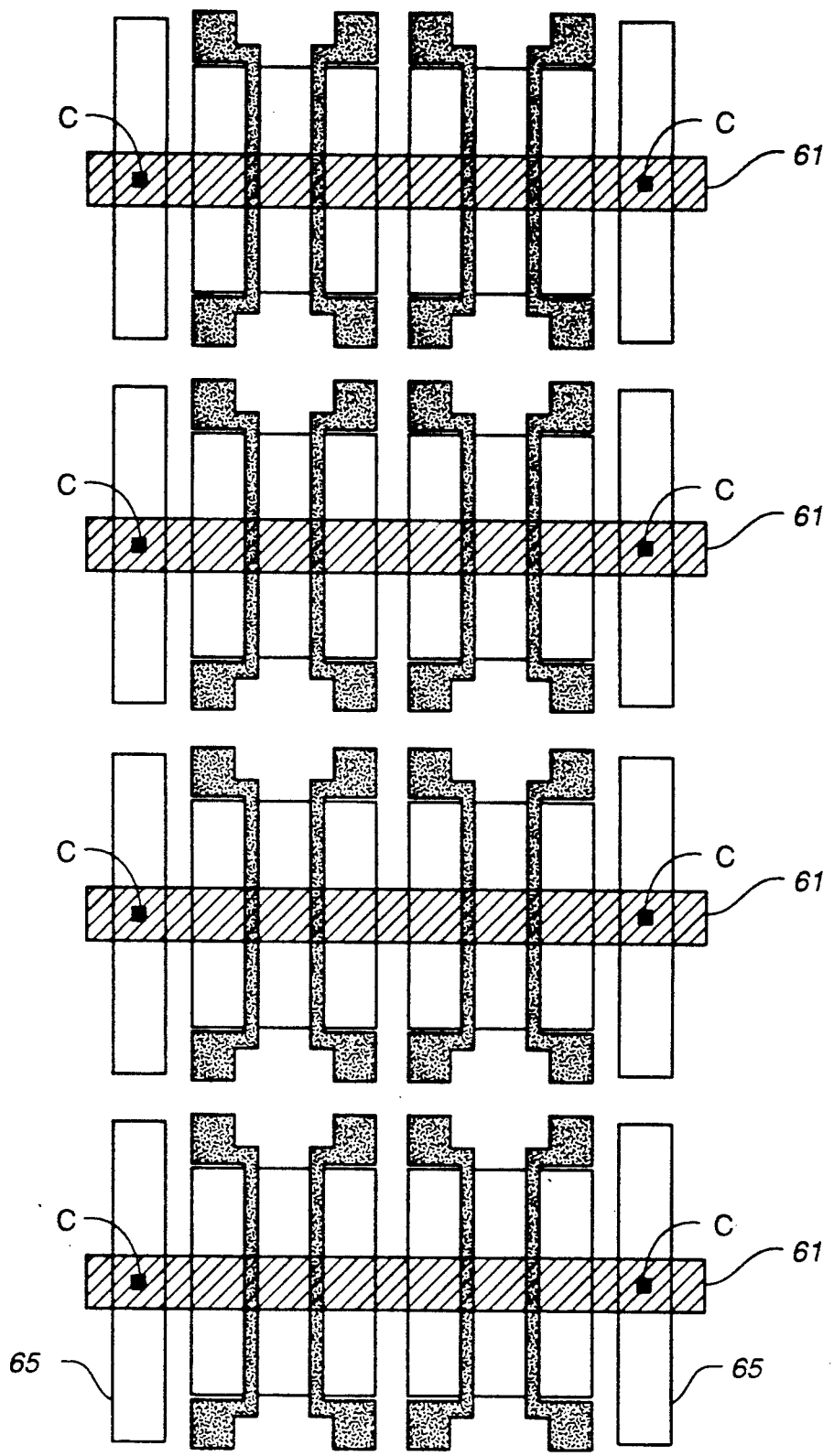
FIG._7
*(PRIOR ART)*

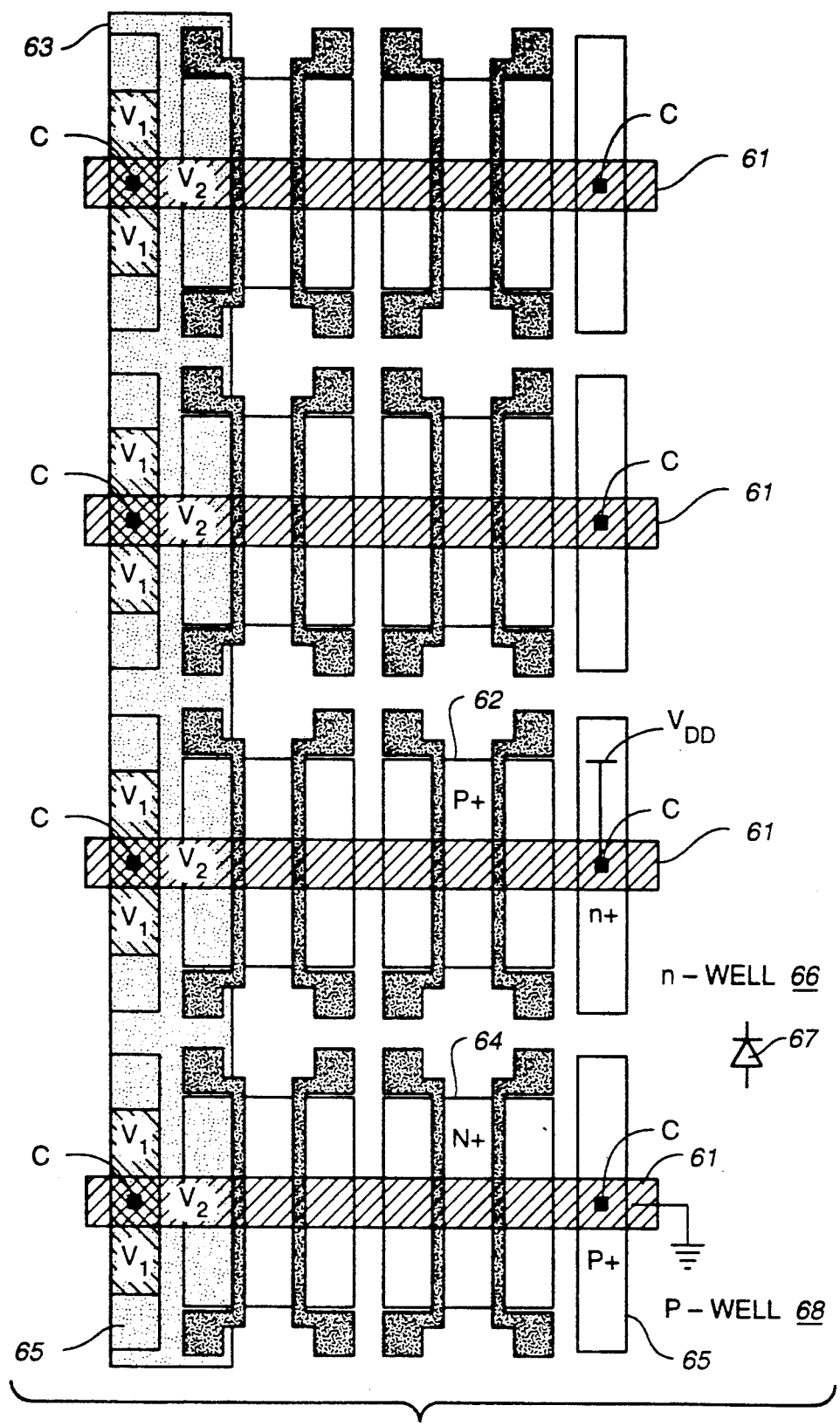
FIG._8
*(PRIOR ART)*

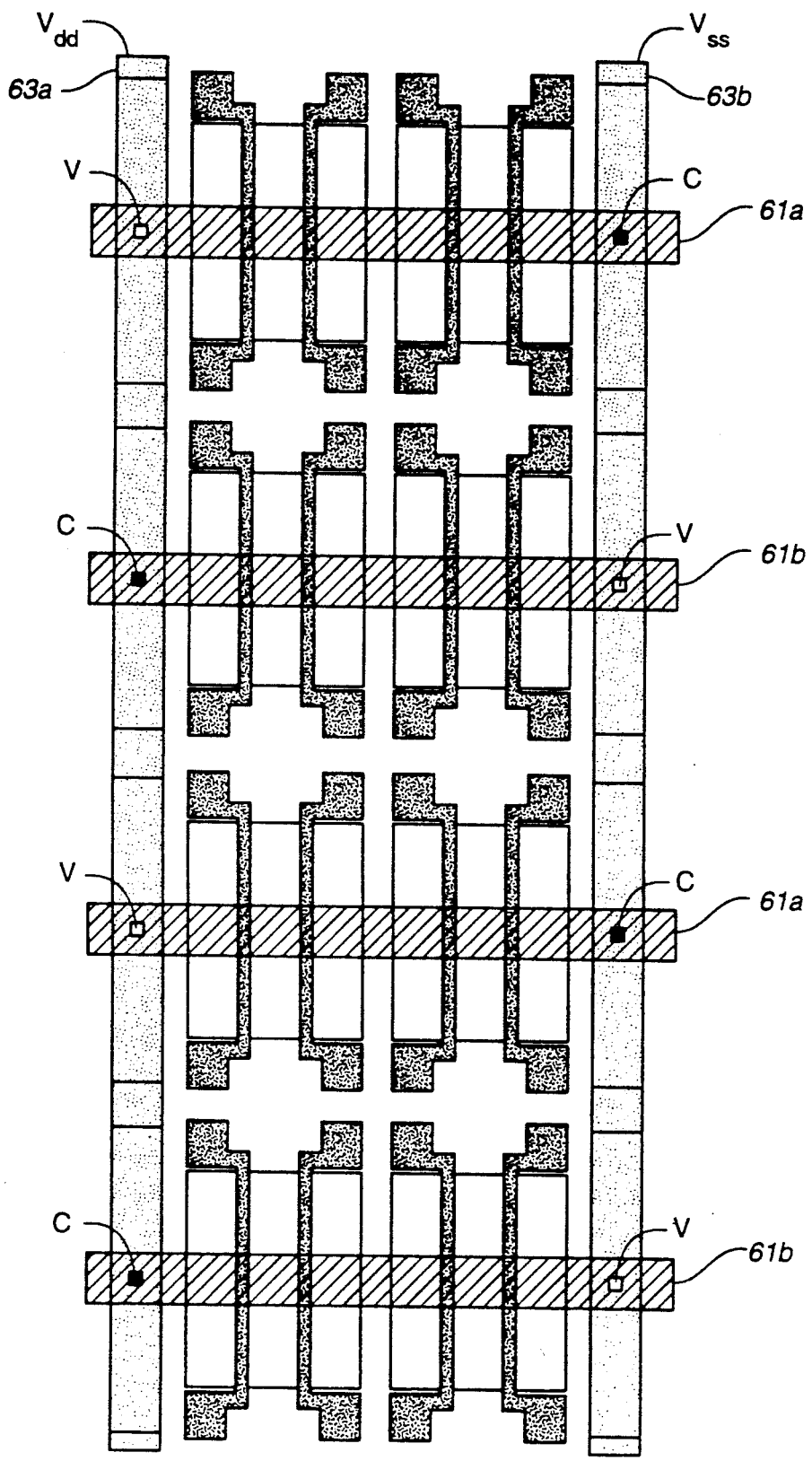
FIG._9

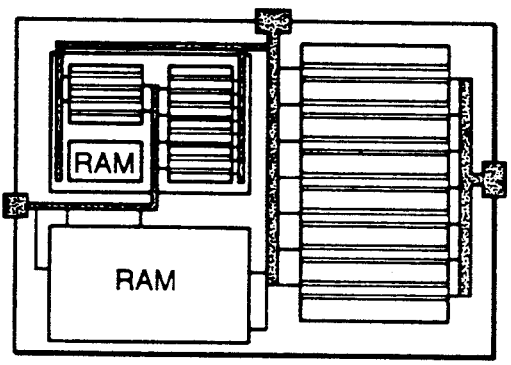
FIG._10A
(PRIOR ART)
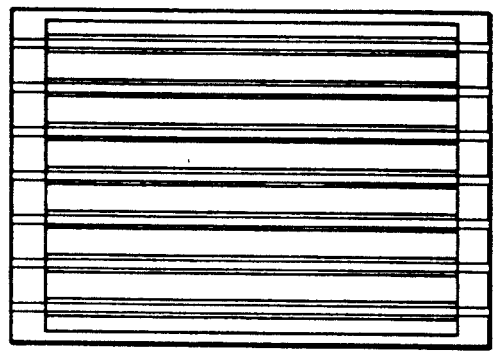
FIG._10B
(PRIOR ART)
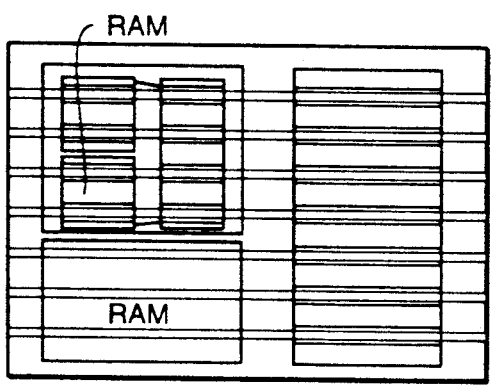
FIG._10C
(PRIOR ART)
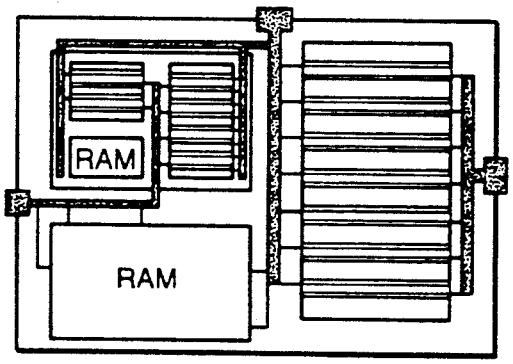
FIG._10D

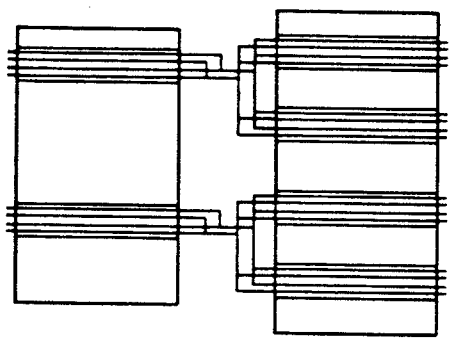
FIG._11A
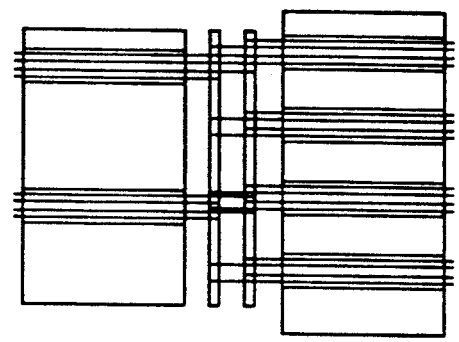
FIG._11B
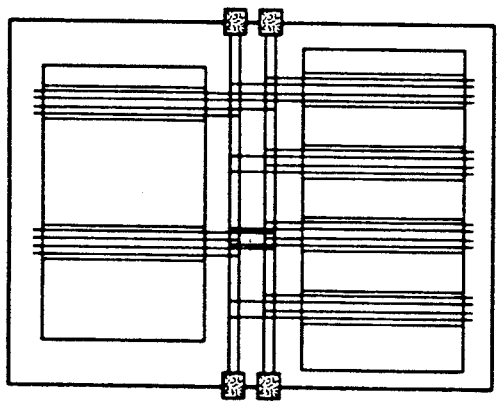
FIG._11C
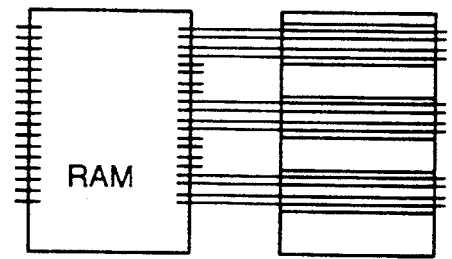
FIG._11D

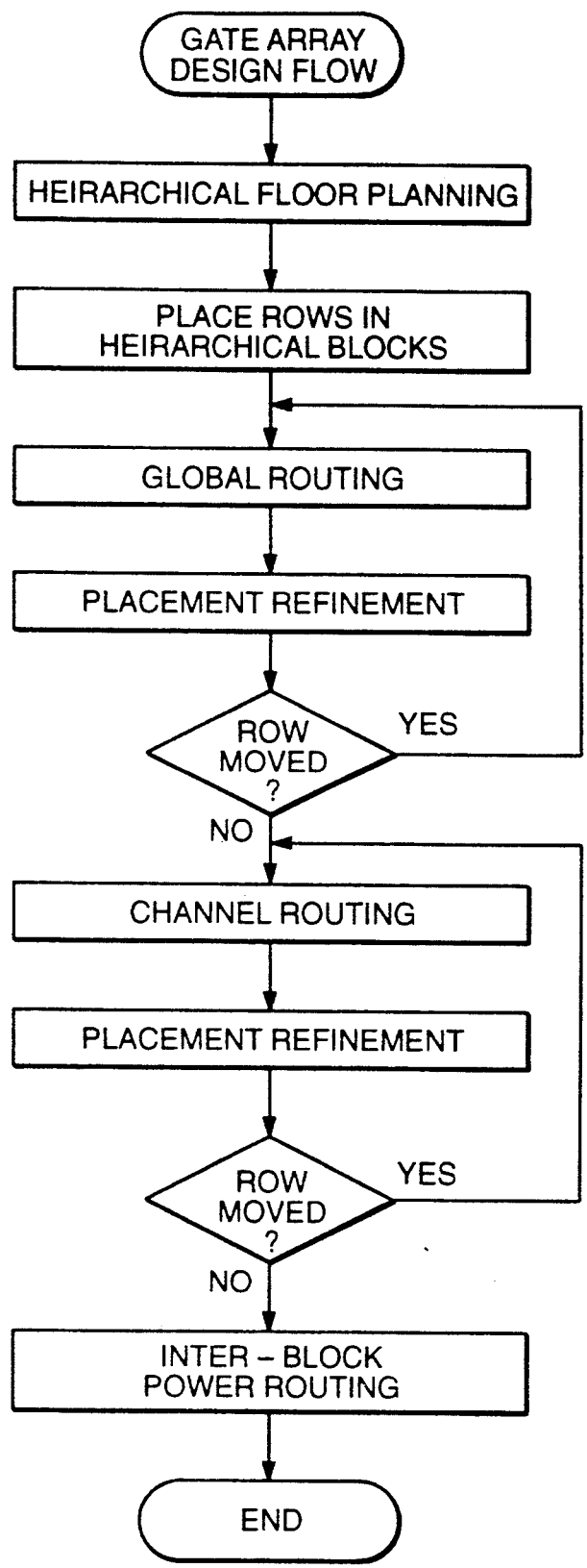
FIG._12 ns with flexible routing

RELATED APPLICATION

The present application is a continuation-in-part of co-pending application Ser. No. 07/902,183 filed in the U.S. Patent and Trademark Office on Jun. 22, 1992 and commonly assigned herewith, the disclosure of which is incorporated herein in its entirety.

BACKGROUND OF THE INVENTION

Field of the Invention

The present invention generally relates to gate array circuits and, more particularly, the present invention relates to large semi-custom integrated circuits that have large gate arrays and large routing channels.

State of the Art

It is well known to use standardized gate arrays to construct semi-custom integrated circuits. An example of a typical semiconductor integrated circuit or "chip" 15 based upon gate arrays is shown in FIG. 1 and is described in U.S. Pat. No. 4,562,453. In this example, the chip 15 has four peripheral blocks 11, 12, 13 and 14 that surround four internal functional gate regions 21, 22, 23 and 24. The spaces between the internal functional gate regions comprise routing channels 31, 32 and 33, for routing wires.

In a gate array chip of the type shown in FIG. 1, the peripheral blocks normally are used for input/output functions such as signal level conversion. In the internal functional gate regions, logic gates are regularly arrayed so that various circuits, herein referred to as "macro cells," can be constructed. The macro cells are interconnected by wiring that passes through the routing channels 31, 32 and 33.

FIG. 2A shows a conventional layout of an internal functional gate region or "gate array base" of a gate array chip. More particularly, the drawing depicts a high-density CMOS gate array wherein rows of P-type transistors alternate with rows of N-type transistors. (In the following discussion, a P-type transistor row and an N-type transistor row are together referred to as a placement row.) The transistors are formed in pairs by extending polysilicon gate lines (e.g., line 47) across P-type or N-type diffusion regions (e.g., region 49). A macro cell might be placed, for instance, in the dark outlined region 53 of the gate array base. A typical macro cell is one placement row high and as many rows wide as necessary to realize its required function.

Further in the conventional layout gate array base shown in FIG. 2A, every "pair of pairs"—that is, every four transistors—is flanked on either side by a substrate connection region (e.g., 51).

FIG. 2B shows a typical example of an AND gate laid out in a macro cell according to the prior art, with the macro cell being a single placement row (i.e., two transistor rows) high. As indicated by the annotations to the drawing, the AND gate is realized from a two input NAND gate—having inputs A1 and A2, and output X—which is connected in series with an inverter to produce an output Z. That is, the left-hand side of the macro cell realizes the NAND gate function and the right-hand side realizes the inverter function.

In FIG. 2B, the solid shading represents polysilicon (e.g., region 37), the cross-hatching represents metal (e.g., region 39), and the large dotted-outline rectangular areas (e.g., region 41) represent diffusion regions. The diffusion regions in the upper half of the macro cell are of the P type, with polysilicon crossing twice above each diffusion region to form four P-type transistors. In the upper left-hand quadrant, the two P-type transistors are connected in parallel by the metal layer so that the transistors share a common output.

In the lower half of the macro cell in FIG. 2B, the diffusion regions are of the N-type with polysilicon crossing twice above each diffusion region to form four N-type transistors. More particularly, in the lower left-hand quadrant, two N-type transistors are connected in series with their output being taken to the right of the gate line farthest to the right. The gates of one of the P-type and one of the N-type transistors are joined together to form an input A1 and the gates of the other P-type and other N-type transistor are joined together to form an input A2. The outputs of the parallel P-type combination and the series N-type combination are connected in common by metal to form the output X of the NAND gate.

As also shown in FIG. 2B, the macro cell includes contacts between metal and diffusion or polysilicon, represented by square outlines (e.g., region 40). The contacts between metal and a hidden metal layer are represented by a darkened square (e.g., region 43) located in substrate connection regions (e.g., region 45) between the basic cells.

When inputs A1 and A2 are both high during operation of the macro cell of FIG. 2B, the P-type transistors are both in the "off" state and the series-connected N-type transistors are both in the "on" state. This configuration results in a low voltage $V_{SS}$ being passed to the output of the second N-type transistor, thereby causing the output to go low. When either inputs A1 or A2 is low, at least one of the parallel-connected P-type transistors is "on," with the result that a high voltage $V_{DD}$ is passed through to the common output of the P-type transistors to cause the output to go high. At the same time, at least one of series-connected N-type transistors is off, with the result that the low voltage $V_{SS}$ is not passed through to the output.

On the inverter side of the macro cell of FIG. 2B, the output of the NAND gate is connected in common to each of the gates of the two P-type and two N-type transistors. When the output is at voltage $V_{SS}$, the P-type transistors are turned on and, as a result, the high voltage $V_{DD}$ is passed through to the output Z and the two N-type transistors are turned off. When output X is high at $V_{SS}$, the N-type transistors are turned on, with the result that the low voltage $V_{SS}$ is passed through to the output Z and the two P-type transistors are turned off.

One limitation of conventional gate arrays is that the routing area cannot be readily increased. One suggested way to this shortcoming is to run routing channels parallel to the transistors, thereby forming a column macro cell. This solution, however, constrains the macro cell sizes to be of fixed width and of a height that is a multiple of a large number of routing tracks (for example, eight). Thus, in this suggested solution, flexibility in routing channel size was gained at the expense of reduced flexibility in sizing macro cells.

Another suggested solution to the above-described shortcoming was to use field isolation (instead of gate isolation) and to separate P-type and N-type transistor gates. With the gates separated, a routing channel can be as small as either the N-type or P transistors. With the P-type and N-type gates connected according to usual gate isolation techniques, by contrast, a routing channel must be as high as the sum of the heights of the P-type and N-type transistors.

Even in field isolated designs, however, the commonly-used routing channel size has been approximately the same as the height of one P-type and N-type transistor. For large gate arrays, the resulting routing channel size is not large enough if the transistors are small. If the transistors are made larger, the routing channel size is less adjustable, since the minimum increment is the height of a P-type or N-type transistor. Large transistors also have larger gate capacitances, a disadvantage in many circuits.

The problem of routing inflexibility of prior art gate arrays becomes particularly acute in the case of large gate arrays. Whereas only recently gate arrays offered about 10K to 20K usable gates, advanced gate arrays now offer upwards of 250K raw gates and 100K usable gates. Routing efficiency therefore becomes of primary concern.

Routing complexity is further increased by the demand for ASICs incorporating user-defined functional hierarchical blocks. Presently, some advanced gate arrays offer user-defined, high-performance, arbitrary functional blocks. The user chooses what blocks and how many blocks he wants at design time. These blocks use transistors from the base, but the wiring within the blocks is pre-routed by cell-generation software to give dense layout and a specific level of performance. Routing of advanced gate arrays requires that the prerouted functional blocks be routed with other gates in the gate array base. As used herein, the term "hierarchical block" is meant to include both blocks that are layed out by placing gate array cells in rows separated by routing channels and then routing interconnections between the cells, as well as "megacells" (for example, RAM and ROM) that do not require any separate routing step.

Power routing becomes particularly problematic in large gate arrays incorporating functional blocks. The size of the gate array often makes it difficult to get enough power into the chip. In the prior art, power busses have typically been of a uniform width (and hence current-carrying capacity) and have extended across the entire chip in the row direction, the column direction, or both. The inflexibility of prior art power routing arrangements, as with the inflexibility of prior art routing arrangements in general, has imposed considerable limits and restraints on gate array design, contrary to the need for flexibility to accommodate user-defined requirements.

SUMMARY OF THE INVENTION

The present invention, generally speaking, provides for flexible routing of gate arrays, increasing routing efficiency, providing for the routing of functional blocks with other gates in the gate array, and providing structures for flexible power routing, particularly of gate arrays having functional blocks. More particularly, in one embodiment of the invention, a gate-array-implemented integrated circuit is designed using a computer by representing in computer memory a gate array base, placing gate array cells on the gate array base in placement rows each having a substantially uniform height and separated by routing channels in which no gate array cells are placed, and routing in the routing channels connections between placement rows according to a netlist, during routing increasing the size of a routing channel if required and decreasing the size of a routing channel if possible by changing the placement of at least one placement row by an amount less than half the height of the placement row. Routing channel size is therefore flexibly adjusted "on-the-fly" during routing, increasing routing efficiency. The adjustment of routing channels in small (5 track) increments is made possible by defining "tall" macros (four transistor rows high) made of "small" (5 track high) transistors. In another embodiment, a gate-array-implemented integrated circuit comprises multiple hierarchical blocks, each including multiple cell placement rows, each of which has a uniform height, and multiple routing channels (unconnected transistors) separating the placement rows. Within each hierarchical block, power routing is provided only within the placement rows. Each hierarchical block is separately optimized for routing efficiency with the result that placement rows (and hence power connections) in different hierarchical blocks are not aligned. Interblock power routing structures are then provided to connect up power busses extending from the edges of different hierarchical blocks.

BRIEF DESCRIPTION OF THE DRAWINGS

The present invention can be further understood with reference to the following description in conjunction with the appended drawings, wherein like elements are provided with the same reference numerals. In the drawings:

FIG. 1 is a plan view of a gate array chip according to the prior art;

FIG. 2A is a plan view of a gate array base according to the prior art;

FIG. 2B is a plan view of a macro cell according to the prior art;

FIG. 3 is the plan view of an AND gate macro cell;

FIG. 4 is a plan view of the gate array base showing a typical arrangement of a placement row and a routing channel;

FIG. 5 is a plan view of an eight input AND gate macro cell;

FIG. 6 is a plan view of an equivalent eight-input AND gate standard cell;

FIG. 7 is a plan view of part of the gate array base of FIG. 2A showing power busses formed conventionally in a first metallization layer and contacts between the power busses and well tie-down regions.

FIG. 8 is a plan view showing in addition to the features of FIG. 5 a power strap formed conventionally in a second metallization layer and via sites for connecting the power strap to the power busses;

FIG. 9 is a plan view of a part of the gate array base of FIG. 4 showing features corresponding to those of FIG. 6 but with vias and contacts placed so as to not interfere with routing;

FIG. 10A is a plan view of a standard-cell chip design;

FIG. 10B is a plan view of a traditional gate-array design;

FIG. 10C is a plan view of a hierarchical gate-array design;

FIG. 10D is a plan view of a hierarchical gate-array design with flexible channels, equivalent to the standard-cell design of FIG. 10A;

FIGS. 11A–11D are plan views of different interblock power-routing structures; and FIG. 12 is a simplified flow chart of a place-and-route routine for gate-array designs.

DESCRIPTION OF THE PREFERRED EMBODIMENTS

Flexible adjustment of routing channel size "on-the-fly" during routing is useful only if the increment of adjustment is small, i.e., a fraction of the size of the routing channel. In the prior art, routing channels have typically occupied one or more entire placement rows. Hence, if a routing channel occupying one placement row needed only one or a few additional routing tracks to complete routing, the size of the routing channel could not be increased except by another entire placement row. Flexible routing in accordance with the present invention in which routing channels are adjusted in small (5 track) increments is made possible by defining "tall" macros (four transistor rows high) made of "small" (5 track high) transistors.

FIG. 3 shows tall macro cells created from small transistors to realize the AND function by providing a placement row that is four transistor rows high as compared to the two transistor rows of FIG. 2B.

Using current technology, the transistor rows of FIGS. 2B and 3 can be each sixteen microns high (five routing tracks at a routing pitch of 3.2 microns).

By using macro cells such as shown in FIG. 3 and by alternating routing channels and cell placement rows as shown in FIG. 4, large routing channels (e.g., twenty routing tracks high) can be achieved without routing over more than fifty-percent of the transistors. If instead macro cells were designed using only two small transistor rows, for example, a routing channel of more than ten tracks would require more than two rows, with the result that more than half the area of the combined area of the macro cell and the routing channel would be dedicated to the routing channel.

In practice, not every routing channel on a gate array need be the same size. Using macro cells such as shown in FIG. 3, for instance, the size of the routing channel can be increased in increments of five routing tracks (which is the size of a transistor row). Routing channels may therefore be of a size "5n" routing tracks where "n" is an integer including 0, resulting in considerable routing flexibility.

Many types of circuits are better implemented using small transistors as in the macro cell of FIG. 3. For example, speed improvements can be achieved by, wherever practicable, having the inputs of the macro cell drive only a single small transistor pair while the outputs of the macro cell are driven by more than one small transistor pair. Thus, the drive capability of a macro cell can be increased without increasing its input load. In FIG. 3, for example, each of the inputs A1 and A2 are used to drive one P-type and one N-type transistor whereas the output Z is driven by two P-type and two N-type transistors.

In the gate array base in FIG. 4, using macro cells four transistor rows high as exemplified by the macro cell of FIG. 3, alternate placement rows may be used for cell placement and routing, respectively, as in the prior art, but the resulting routing channel is now twenty routing tracks high, sufficient for routing of large, dense gate arrays. Routing channels nevertheless do not occupy more than 50% of the gate array base. Furthermore, if a routing channel more or less than twenty routing tracks high is needed, the routing channel may be easily increased in increments of five routing tracks. Also, because the transistors are made small, versatility is achieved since small transistors are available for circuits requiring them and small transistors may be interconnected as necessary to form large transistors to create large drive macro cells wherever necessary.

Flexible routing enables standard cell routing techniques to be adapted for use with gate arrays. Standard cells, like macro cells, are cells of uniform heights that may be arranged in rows and interconnected by routing to form more complex circuits. Standard cells, for example, might be 96 microns tall with variable width. Standard cells are placed in rows and abutted to connect horizontal power rails within each cell. Between the rows of standard cells are routing channels. Unlike gate array macro cells, however, within a standard cell, transistors may be located at whatever location necessary to realize a compact, dense design. As a result, relatively simple gate array macro cells may have an area $2\frac{1}{4}$ times as great as the area of a corresponding standard cell. By reducing the transistor size and inter-transistor spacing along the base transistor-array, the difference in size between macro cells and standard cells may be reduced considerably. FIG. 6, for example, shows an 8-input and gate-array cell. The cell is approximately 1.4 times as large as an equivalent standard cell shown in FIG. 6. In general, the gate-array cells described herein are 20 tracks tall (150 microns) with variable width.

Since standard cells are laid out on blank silicon, rows of standard cells may be moved in almost arbitrarily small increments if desired. (Typically, rows of standard cells are moved in 1-track increments.) Standard cell routing techniques are able to take advantage of this feature to achieve high routing efficiency. Standard-cell design tools use a channel router to route interconnections within the channels. During channel routing, a channel router changes the distance between the rows for a dense route with no unroutes. Traditional gate-array cells, on the other hand, are essentially fixed to the position placed at. Any cell move is limited to the next available slot in the transistor array. Gate array rows have not been readily moveable during routing. Conventional Gate array design tools use a maze router or a fixed-channel router to route interconnections within a fixed routing region having fixed sides. If the routing region is too small, then the router will not complete the routing of connections. If the fixed routing region is too large, then the router allows the extra space to be wasted, either as dead space or by routing less densely.

By reducing the transistor size, allowing placement rows to be moved in relatively fine increments, standard-cell placement and routing may be performed on the gate-array base, achieving high routing efficiency. By modifying a standard cell channel router to dynamically flex channel widths during channel routing by an increment of, instead of one track, five tracks consistent with the described gate array base, the standard cell channel router may be used on the gate array base to achieve optimal routing without producing unroutes.

Experimental results indicate that as chip size increases, the management of routing becomes more important than differences in individual cell sizes between standard cells and gate array cells. Each of seven different netlists was routed into two chips with 0.8 um technology, one chip with standard-cells and one chip with gate-array cells. The data listed in Table 1 is the ratio of the gate-array values divided by the standard-cell values. As the size of the netlists increase, the ratios for chip area, transistor density, and routing factor all approach the value of one. The area of large chips is therefore seen to be more a function of routing than of whether gate-array cells or standard cells are used. The greatest improvement in area efficiency may therefore be obtained not by minimizing the difference in size between gate-array cells and equivalent standard cells but rather by increasing routing efficiency using the techniques described herein.

TABLE 1

| Netlist | # of Nets | # of Cells | Chip Area (GA/SC) | Transistor Density (GA/SC) | Routing Factor (GA/SC) |
|---|---|---|---|---|---|
| 1 | 10997 | 10576 | 1.22 | .66 | 2.0 |
| 2 | 3514 | 3558 | 1.64 | .62 | 3.0 |
| 3 | 3456 | 3236 | 1.56 | .59 | 2.78 |
| 4 | 1551 | 1515 | 2.48 | .43 | 5.80 |
| 5 | 1074 | 1134 | 2.54 | .36 | 5.83 |
| 6 | 787 | 715 | 3.55 | .26 | 11.75 |
| 7 | 693 | 682 | 3.77 | .22 | 13.75 |

With fine transistors, power wires can no longer be a function of the gate-array base, since they would use up an inordinate amount of routing area. Instead, power wires are made to run only in rows, with column power wires being added as necessary to get more power into the base. Preferably, power routing is performed so as to leave as much area as possible available for non-power routing.

A problem encountered in the prior art is the obstruction of potential routing tracks by a known power grid arrangement shown in FIGS. 7 and 8. FIG. 7 shows a portion of the power grid formed in a first metallization layer (metal1), and FIG. 8 shows in addition the portion of the power grid formed in a second metallization layer (metal2). Referring first to FIG. 7, metal1 busses 61 are formed horizontally through the middle of each transistor row. The busses 61 cross the gate electrodes of all the transistors and also cross well-tie diffusion regions 65 formed at four transistor intervals along each transistor row. Conventionally, wherever one of the metal1 busses 61 crosses a well-tie diffusion region 65, a contact is formed between the bus and the diffusion region for purposes to be explained presently in connection with FIG. 8.

Referring now to FIG. 8, opposite types of transistors are formed in alternate transistor rows by, for example, forming P+ diffusion regions 62 in n- wells 66 to form P-type transistors and by forming N+ diffusion regions 64 in P−wells 68 to form N-type transistors. Where adjacent n- and P- wells adjoin, parasitic diodes 67 are formed that, if allowed to enter a conductive state, may cause circuit latch-up. Well-tie diffusion regions 65 are provided to ensure that the parasitic diodes 67 are always reverse biased. For example, in the n-wells 66, the well-tie region 65 are formed of n+ diffusion (to minimize voltage drop across the well-tie diffusion region) and tied to voltage $V_{DD}$ supplied by one of the metal1 busses 61. In the P- wells 68, well-tie regions 65 are formed of P+ diffusion and are tied to voltage $V_{SS}$ (ground) supplied by one of the metal1 busses 61. As a result, the parasitic diodes 67 are always reverse biased.

To complete the power grid, metal2 straps 63 are formed vertically and connected by vias to metal1 busses 61 supplying the same voltage. Complications arise, however, because vias and contacts are not allowed to occupy the same area on the chip (i.e., vias and contacts cannot be formed on top of one another). Moreover, what would otherwise be the preferred locations for vias connecting the metal2 straps 63 to the metal1 busses 61 are already occupied by contacts C connecting the metal1 busses 61 to the well-tie diffusions 65. As a result, in the prior art, vertical stubs have been extended from the metal1 busses 61 underlying the metal2 strap 63, so as to allow vias to be placed as necessary in the locations V1 spaced apart vertically from the contacts C. Also, the metal2 straps 63 have been made wider than (twice as wide as) the metal1 busses 61, allowing vias to be placed as necessary in the locations V2.

The disadvantage of such a technique is that routing tracks are obstructed. A grid of dots superimposed on the field of FIG. 8 (and also FIGS. 7 and 9) indicates potential routing tracks. If a via is placed at any of the locations V1, a potential horizontal routing track in the metal1 layer is obstructed. If a via is placed at any of the locations V2, a potential vertical routing track in the metal2 layer is obstructed. This situation limits the placement of macros that require use of these routing tracks.

Routing flexibility may be further enhanced using a transparent gate array power grid that does not obstruct potential routing tracks as in FIG. 8, previously described. Referring to FIG. 9, the horizontal metal1 busses 61 alternately supply $V_{DD}$ (busses 61a) and $V_{SS}$ (busses 61b). The vertical metal2 straps, in contrast to the prior art, are only one routing track wide. The vertical metal2 straps 63 also alternately supply $V_{DD}$ (strap 63a) and $V_{SS}$ (strap 63b). Therefore, whether traversing a metal1 bus or a metal2 strap, power lines of the same type intersect only every other intersection. Where a bus 61 and a strap 63 of the same type intersect at locations V, vias are placed connecting the busses and the straps. Where busses and straps of different types intersect at locations C, contacts are placed connecting the metal1 busses to the underlying well tie-down regions. The intersections between the metal1 busses and the metal2 straps are occupied alternately by vias and contacts. Successive contacts between the metal1 busses and the well tie-down regions are located no more than four transistor columns (14 routing tracks) apart, twice as far apart as in the prior art but sufficiently close to prevent latch-up using a preferred technology (0.8µ CMOS).

Furthermore, contacts may be placed more frequently as circumstances allow. Rather than the placement of contacts being predetermined in connection with layout of the gate array base or in connection with layout of the macros themselves, placement of the contacts is determined at a later design stage in connection with layout of the power grid. When a routing track vertically adjacent the location of via between a metal1 bus and a metal2 strap remains unoccupied, an additional contact is placed in the vertically adjacent position, a vertical stub being extended from the metal1 bus to allow for placement of the contact, such that the location that would have been occupied in the prior art by a via is replaced by a contact between the metal1 bus and the underlying well-tie down region.

Metal2 straps need not be placed over all of the well tie-down regions. Rather, the metal2 straps may be used only as required. Additional contact/via locations, instead of being occupied by vias, are thereby freed up for the placement of contacts between the metal1 busses an the well tie-down regions.

The flexible routing structures thus far described may be used to particular advantage in gate arrays incorporating functional blocks, providing maximum flexibility to accommodate user-defined requirements in gate array designs. Although not entirely realizable, the goal of advanced gate array design in accordance with the present invention is to provide comparable flexibility as standard cell designs in accommodating user-defined requirements. A typical standard cell design is shown, for example, in FIG. 10A. A traditional gate-array design, shown in FIG. 10B, does not afford the flexibility to accommodate as such user-defined functional blocks, e.g., the large and small RAMs in FIG. 10A. Rather cell rows and power busses extend across the width of the chip, cell rows being separated by routing channels that are a multiple of (usually one) placement rows high. Hierarchical gate array design techniques are known in the art as illustrated by FIG. 10C, for example. Nevertheless, although channel widths might be flexible (statically) and hierarchical blocks may exist, the rows of the hierarchical blocks have been required to always line up to achieve continuous power routing.

Using dynamically flexible channels and inter-block power routing structures to be presently described, a hierarchical gate array design may be achieved (FIG. 10D) whose size and performance very nearly approach that of the standard-cell design. Hierarchical blocks are independently optimized during routing, using the feature of dynamically flexible channels, without regard to alignment of rows in different hierarchical blocks. Inter-block power routing is performed as in standard-cell designs, using a variety of power-routing structures.

FIG. 11A illustrates power routing between hierarchical blocks using sub-net partitions. The hierarchical block is partitioned into sub-nets each including two rows, and each sub-net is connected to a corresponding row in the hierarchical block. According to a net-in-channel inter-block power-routing structure, FIG. 11B, all rows in the hierarchical blocks are connected by a central metal2 bar in a channel of varying width. The default width of the channel is 1 track. In FIG. 11C, all rows in the hierarchical blocks are connected by a vertical metal2 power strap of varying width running down the middle of the channel. Finally, in the case of a RAM block (FIG. 11D), all rows in the gate-array area connect directly to pin connections on the RAM block. RAM block pin connections are spaced every 5 tracks for metal1 straps.

A simplified flowchart of a place-and-route routine that may be used to achieve high routing efficiency in hierarchical gate-array designs is shown in FIG. 12. In a first step, a hierarchical floor plan is created by first loading a netlist into memory of a computer workstation (for example, a 6-MIP super-mini computer) and using graphical interactive commands to design a floor plan. Functional blocks (e.g., RAMs, ROMs) are oriented and placed, and rectangular regions are defined to form hierarchical areas. In a next step, the system places gate array macro cells into these areas, using, for example, well-known placement algorithms (such as min-cut and force-direction). Global (coarse) routing is then performed, followed by a placement refinement step in which the size of a routing channel is increased if necessary or decreased if possible by changing the placement of one or more placement rows. If a placement row is moved, global routing is repeated, followed again by placement refinement until global routing has been optimized. Global routing is followed by detailed routing using a modified standard-cell channel router (for example, a standard-cell channel router known in the art as "YACR2", modified to change channel widths in 5 track rather than 1 track increments). As channel routing proceeds, channel widths are dynamically flexed by moving rows within the hierarchical blocks. As with global routing, Placement refinement is performed in an iterative process until routing of each hierarchical block has been successfully completed. Once the rows in the hierarchical blocks have been finally placed and channel routing completed, inter-block power routing is performed to connect up the row ends, using a power-routing structure such as those in FIGS. 11A–11D.

By placing gate-array cells in rows and providing for flexible channels, a gate-array design can be made nearly as small as a standard-cell design of the same netlist for sufficiently large netlists. Using standard-cell routing techniques, dense routing of gate arrays may be achieved. Hierarchical blocks may be separately optimized without regard to alignment of rows in different functional blocks by employing the described flexible power routing structures.

The foregoing has described the principles, preferred embodiments and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of present invention as defined by the following claims.

What is claimed is:

1. A gate-array-implemented integrated circuit, comprising:
   a gate array base having multiple transistor rows, each transistor row containing multiple transistors of a given-type, alternate transistor rows containing transistors of opposite types;
   a plurality of hierarchical blocks formed on said gate-array base, each including a plurality of cell placement rows, each of which has a substantially uniform height, and a plurality of routing channels separating said placement rows and containing only logic interconnections between cell placement rows;
   wherein placement rows in different hierarchical blocks are not aligned.

2. The apparatus of claim 1 wherein each of said placement rows contains a line extending substantially an entire length of said placement row for carrying a power supply voltage.

3. The apparatus of claim 2 further comprising a plurality of inter-block routing channels separating said plurality of hierarchical blocks.

4. The apparatus of claim 3 further comprising power interconnect lines within said inter-block routing channels for connecting lines for carrying a power supply voltage in one hierarchical block to lines for carrying a power supply voltage in another hierarchical block.

5. The apparatus of claim 4 wherein, within at least one of said hierarchical blocks, different routing channels are of different heights.

* * * * *